(12) United States Patent
Sampayan

(10) Patent No.: US 9,748,859 B2
(45) Date of Patent: Aug. 29, 2017

(54) FOUR-TERMINAL CIRCUIT ELEMENT WITH PHOTONIC CORE

(71) Applicant: Lawrence Livermore National Security, LLC, Livermore, CA (US)

(72) Inventor: Stephen Sampayan, Manteca, CA (US)

(73) Assignee: Lawrence Livermore National Security, LLC, Livermore, CA (US)

(\*) Notice: Subject to any disclaimer, the term of this patent is extended or adjusted under 35 U.S.C. 154(b) by 518 days.

(21) Appl. No.: 14/444,980

(22) Filed: Jul. 28, 2014

(65) Prior Publication Data

US 2015/0028674 A1   Jan. 29, 2015

Related U.S. Application Data

(60) Provisional application No. 61/859,173, filed on Jul. 26, 2013.

(51) Int. Cl.
*H02J 1/10* (2006.01)
*H02M 7/12* (2006.01)
*H03K 17/78* (2006.01)
*H02M 1/08* (2006.01)

(52) U.S. Cl.
CPC ............. *H02M 7/12* (2013.01); *H03K 17/78* (2013.01); *H02M 1/08* (2013.01); *Y10T 307/50* (2015.04)

(58) Field of Classification Search
CPC .......... H03K 17/78; H02M 1/08; H02M 7/12; Y10T 307/50
USPC .................................................... 307/43, 117
See application file for complete search history.

(56) References Cited

U.S. PATENT DOCUMENTS 3,192,387 A    6/1965  Goodman
2013/0328146 A1\*  12/2013  Nelson ................ H01L 31/0224
                                                                 257/432

\* cited by examiner

*Primary Examiner* — Carlos Amaya
(74) *Attorney, Agent, or Firm* — Perkins Coie LLP

(57) ABSTRACT

A four-terminal circuit element is described that includes a photonic core inside of the circuit element that uses a wide bandgap semiconductor material that exhibits photoconductivity and allows current flow through the material in response to the light that is incident on the wide bandgap material. The four-terminal circuit element can be configured based on various hardware structures using a single piece or multiple pieces or layers of a wide bandgap semiconductor material to achieve various designed electrical properties such as high switching voltages by using the photoconductive feature beyond the breakdown voltages of semiconductor devices or circuits operated based on electrical bias or control designs. The photonic core aspect of the four-terminal circuit element provides unique features that enable versatile circuit applications to either replace the semiconductor transistor-based circuit elements or semiconductor diode-based circuit elements.

30 Claims, 17 Drawing Sheets

FIG. 13(C)  1st Half Cycle

FIG. 13(D)  2nd Half Cycle

US 9,748,859 B2

FOUR-TERMINAL CIRCUIT ELEMENT WITH PHOTONIC CORE

CROSS-REFERENCES TO RELATED APPLICATIONS

This patent document claims the benefit of priority of U.S. Provisional Application No. 61/859,173, entitled "4-Terminal Circuit Element with Photonic Core and Its Applications," and filed on Jul. 26, 2013. The entire content of the aforementioned provisional application is herein incorporated by reference for all purposes.

STATEMENT REGARDING FEDERALLY SPONSORED RESEARCH

The United States Government has rights in this invention pursuant to Contract No. DE-AC52-07NA27344 between the United States Department of Energy and Lawrence Livermore National Security, LLC for the operation of Lawrence Livermore National Laboratory.

TECHNICAL FIELD

The subject matter of this patent document circuits and devices, including circuits and devices having circuit elements based on photonic elements or devices.

BACKGROUND

Most electronic circuits and devices are constructed by using only electronic circuit elements such as conductors, resistors, capacitors, inductors and transistors. Such electronic circuits and devices based on all electronic components, however, may be limited in performance and operations for certain applications.

SUMMARY

This patent document discloses designs and implementations of a circuit element that includes four electrical terminals based on a photonic core inside of the circuit that uses a wide bandgap semiconductor material. The wide bandgap material exhibits photoconductivity in response to the light incident thereon to control the current flowing through the material. The four terminal circuit element can be used in a variety of circuits and in different configurations that allows the circuit element to operate as, and replace, conventional semiconductor transistor-based circuit elements or semiconductor diode-based circuit elements.

One aspect of the disclosed embodiments relates to a four-terminal circuit element with a photonic core that includes a first terminal that provides a first electrical contact, a second terminal that provides a second electrical contact, a third terminal that provides a third electrical contact and a fourth terminal that provides a fourth electrical contact. The four-terminal circuit element also includes a light source coupled to the first and the second terminals to receive an electrical signal and operable to produce light in response to the electrical signal, and a wide bandgap material in contact with a first electrode coupled to the third terminal and a second electrode coupled to the fourth terminals to allow an electrical current to flow between the first and second electrodes, the wideband gap material positioned to receive the light produced by the light source and configured to exhibit a photoconductivity in response to the received light. One or both of the first and the second terminals are operable as input terminals to receive an input controlling signal, and one or both of the third and the fourth terminals are operable as output terminals to provide an output signal controlled at least in-part by the input controlling signal. For example, such an output signal can be a continuously varying output signal.

In one exemplary embodiment, the wide bandgap material comprises silicon carbide (SiC) or gallium nitride (GaN). In another exemplary embodiment, the light source comprises one of a semiconductor laser or a semiconductor light-emitting diode. The light source can, for example, be a laser light source operable with an efficiency in the range 1 to 10 percent. In yet another exemplary embodiment, the continuously varying output signal varies in response to a change in photoconductivity of the wide bandgap material caused at least in-part by the received light at the wide bandgap material. In still another exemplary embodiment, the continuously varying output signal is an amplified version of the input controlling signal.

According to one exemplary embodiment, the four-terminal circuit element is operable to produce a power gain in the range 15 to 30 decibels. In another exemplary embodiment, the four-terminal circuit element is operable at a frequency of at least 100 MHz. In still another exemplary embodiment, the four-terminal circuit element is operable to produce the output signal having a power of at least 200 megawatts. In another exemplary embodiment, the electrical signal provided to the first and the second terminals is at an arbitrary potential level relative to a potential level established across the wide bandgap material.

In one exemplary embodiment, the four-terminal circuit element is operable as an electrical active circuit element, while in another exemplary embodiment the four-terminal circuit element is operable to function as a plurality of active elements in a plurality of corresponding configurations. For example, the four-terminal circuit element can be operable to function as a diode in a first configuration and as a transistor in a second configuration. In another exemplary embodiment, the four-terminal circuit element includes a plurality of wide bandgap elements, where each wide bandgap element is positioned between a pair of corresponding contact electrodes to maintain at least a first of the plurality of wide bandgap elements at a different potential level than at least a second of the plurality of wide bandgap elements. In such a configuration, each wide bandgap elements can be positioned to receive the light produced by the light source. In one exemplary embodiment, one of the contact electrodes from each of the wide bandgap elements is at a common potential level, thereby allowing a very large voltage output to be generated across the stack of such wide bandgap elements.

Another aspect of the disclosed embodiments relates to a circuit that includes one or more power supplies, one or more passive circuit elements, and at least one four-terminal circuit element. The four-terminal circuit element includes a first terminal that provides a first electrical contact, a second terminal that provides a second electrical contact, a third terminal that provides a third electrical contact, and a fourth terminal that provides a fourth electrical contact. The four-terminal circuit element also includes a light source coupled to the first and the second terminals to receive an electrical signal and operable to produce light in response to the electrical signal, as well as a wide bandgap material in contact with a first electrode coupled to the third terminal and a second electrode coupled to the fourth terminals to allow an electrical current to flow between the first and second electrodes. The wideband gap material is positioned to receive the light produced by the light source and is configured to exhibit a photoconductivity in response to the received light. In such a circuit, one or both of the first and the second terminals are operable as input terminals of the four-terminal circuit element to receive an input controlling signal, and one or both of the third and the fourth terminals are operable as output terminals of the four-terminal circuit element to provide an output signal controlled at least in-part by the input controlling signal.

In one exemplary embodiment, the four-terminal circuit element is configured to operate as an active element in the circuit. In another exemplary embodiment, the circuit is configured as an amplifier circuit and includes a first passive element coupled to the second terminal, a second passive element coupled to the third terminal, and a third passive element coupled to the fourth terminal, where the second terminal is at a ground potential level. For example, the second, fourth and third terminals can be configured as a gate, drain and source transistor terminals, respectively. One or more of the first, second or third passive elements can be resistors.

According to one exemplary embodiment, the circuit is an oscillator circuit, and the four-terminal circuit element is configured to operate as a transistor in the oscillator circuit. For example, the oscillator circuit can be one of a Hartley oscillator circuit or a Colpitts oscillator circuit. In another exemplary embodiment, the circuit is a crystal oscillator circuit, and the four-terminal circuit element is configured to operate as an active element in the oscillator circuit. In still another exemplary embodiment, the circuit is an amplifier circuit, and the four-terminal circuit element is configured to operate as an active element in the amplifier circuit. In yet another exemplary embodiment, the circuit is an AC-to-DC converter circuit, and the four-terminal circuit element is configured to operate as an active element in the an AC-to-DC converter circuit.

In one exemplary embodiment, the circuit is a generator controller circuit, and the four-terminal circuit element is configured to operate as an active element in the generator controller circuit. In another exemplary embodiment, the circuit is a motor controller circuit, and the four-terminal circuit element is configured to operate as an active element in the motor controller circuit.

According to another exemplary embodiment, the first terminal and the third terminal of the four-terminal circuit element are connected to each other to form a common electrical terminal to render the four-terminal circuit element a 3-terminal circuit element having the common electrical terminal and the second and fourth terminals that are coupled to the one or more passive elements. In yet another exemplary embodiment, the output signal of the four-terminal circuit element is continuously variable in response to at least in-part variations in the input controlling signal. In one exemplary embodiment, the four-terminal circuit element is configured to replace an active element in the circuit. For example, the active element is one of: a diode, a transistor, or a signal source.

The above and other features and their embodiments or implementations are described in greater detail in the drawings, the description and the claims.

BRIEF DESCRIPTION OF THE DRAWINGS

FIGS. 13(A) to 13(D) illustrate a DC-to-AC inverter circuit in which two transistors are replaced with two opticondistors with an exemplary embodiment.

DETAILED DESCRIPTION

This patent document discloses designs and implementations of circuits, circuit components or elements including four electrical terminals based on a photonic core inside of the circuit that uses a wide bandgap semiconductor material that exhibits photoconductivity where light can be turned or off in the material to control the current flowing through the material. It is also understood that the photonic core can have different states between fully off and fully on as controlled by the light source. The disclosed 4-terminal circuit element can be configured based on various hardware structures using a single piece or multiple pieces or layers of a wide bandgap semiconductor material to achieve various designed electrical properties such as high switching voltages by using the photoconductive feature beyond the breakdown voltages of semiconductor devices or circuits operated based on electrical bias or control designs. Therefore, the photonic core aspect of the disclosed 4-terminal circuit element provides unique features that enable versatile circuit applications to either replace the semiconductor transistor-based circuit elements or semiconductor diode-based circuit elements. In addition, the disclosed 4-terminal circuit element can be used to construct circuits and devices that are difficult to achieve with semiconductor transistors or diodes as active circuit elements. Circuit designs below provide examples of various applications of the disclosed 4-terminal circuit element.

Figure 1:
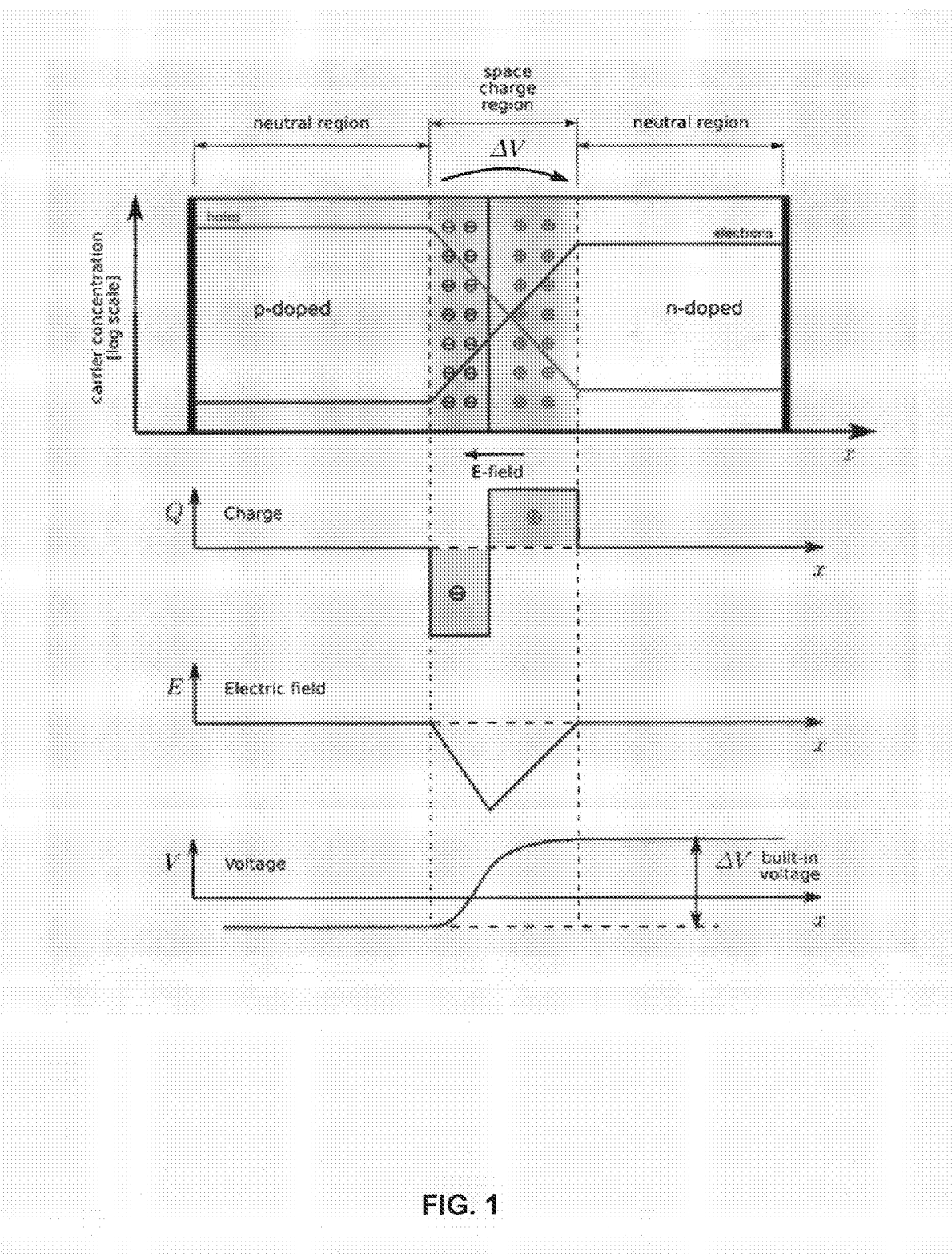
FIG. 1 illustrates a p-n junction, the associated space charge and neutral regions and the corresponding change electric field and voltage plots.

Semiconductor junction devices such as semiconductor diodes and semiconductor transistors have versatile applications on electronic circuits and devices. However, one of the limitations of semiconductor junction devices is their limited voltage that can be applied to the p-n junctions without causing undesired breakdown of the p-n junctions. This limitation results since most of the applied voltage is confined to the very thin region on either side of the junction (see FIG. 1). This region is commonly referred to as the depletion region and is identified as the "space charge region" in FIG. 1. The thickness of this region is governed by many of the physics processes occurring in the device and can generally be only microns thick for most doping amounts. As a result, very little voltage divides across the bulk of the device (e.g., the thick vertical lines on the left extreme of the p-doped and the right extreme of the n-doped regions below). This effect is illustrated in the schematically represented voltage curve in FIG. 1. Thus, the volume between the depletion region boundaries and the electrodes (labeled "neutral region") are largely useless in increasing the amount of voltage that can be applied to the overall device. For junction devices made from GaN and SiC, this breakdown can occur in the range of 400 to 4,000 V across the device.

The disclosed 4-terminal circuit element having a photonic core can be used to replace certain semiconductor junction devices such as transistors or diodes to achieve operations under higher voltages beyond the breakdown voltages in semiconductor p-n junctions. In some implementations, the disclosed 4-terminal circuit element can include two electrical terminals 1 and 2 as input terminals for driving, biasing or modulating the circuit element and two electrical terminals 3 and 4 as output terminals to produce one or two output signals caused by the input at the input terminals. Notably, different from a typical 3-terminal design of electronic transistors such as semiconductor-based transistors, the two electrical terminals 1 and 2 as input terminals of the disclosed 4-terminal circuit element can be, due to the use of the photonic core, separated from the output terminals 3 and 4 and this aspect of the disclosed 4-terminal circuit element can be used to construct novel circuits and devices that may be difficult to implement by using the conventional 3-terminal transistors.

The wide bandgap semiconductor material that exhibits a photoconductivity inside the photonic core of the disclosed 4-terminal circuit element can be optically excited so that the entire wide bandgap semiconductor material can be under the optical illumination to exhibit the desired photoconductivity to enable modulation of the conductivity of the entirety or the bulk of the material. In such a device, the entirety of the crystal participates in the conduction process. For instance, a 100 micron thick crystal will have the capability of withstanding 40 kV and would replace ten equivalent junction devices. Thus, unlike conventional junction devices, the wide bandgap material can be made arbitrarily thick to accommodate higher voltages in a single device. The disclosed 4-terminal circuit element is referred to as an "opticondistor" given its unique electrical properties based on the optical conductivity.

Figure 2A:
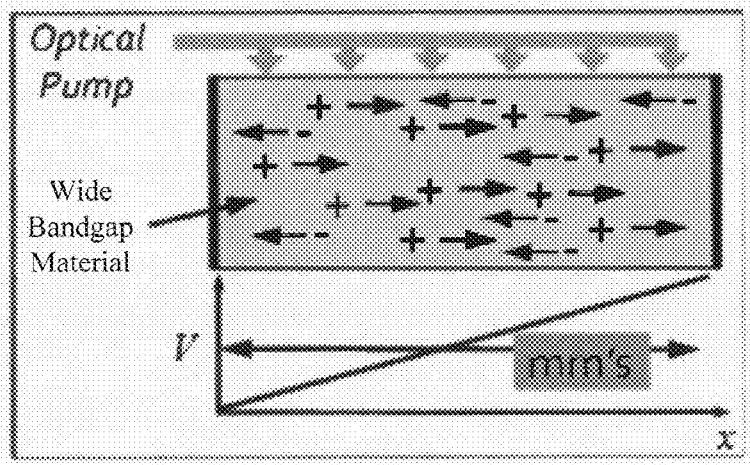
FIG. 2(A) illustrates the operation of a photonic core of a 4-terminal circuit element in accordance with an exemplary embodiment.

FIG. 2(A) illustrates the operation of the photonic core of the disclosed 4-terminal circuit element in accordance with an exemplary embodiment. The wide bandgap material is under optical pumping from an electrically driven light source inside the circuit element. The plot in FIG. 2(A) illustrates the output voltage as a function of distance, x.

Figure 2B:
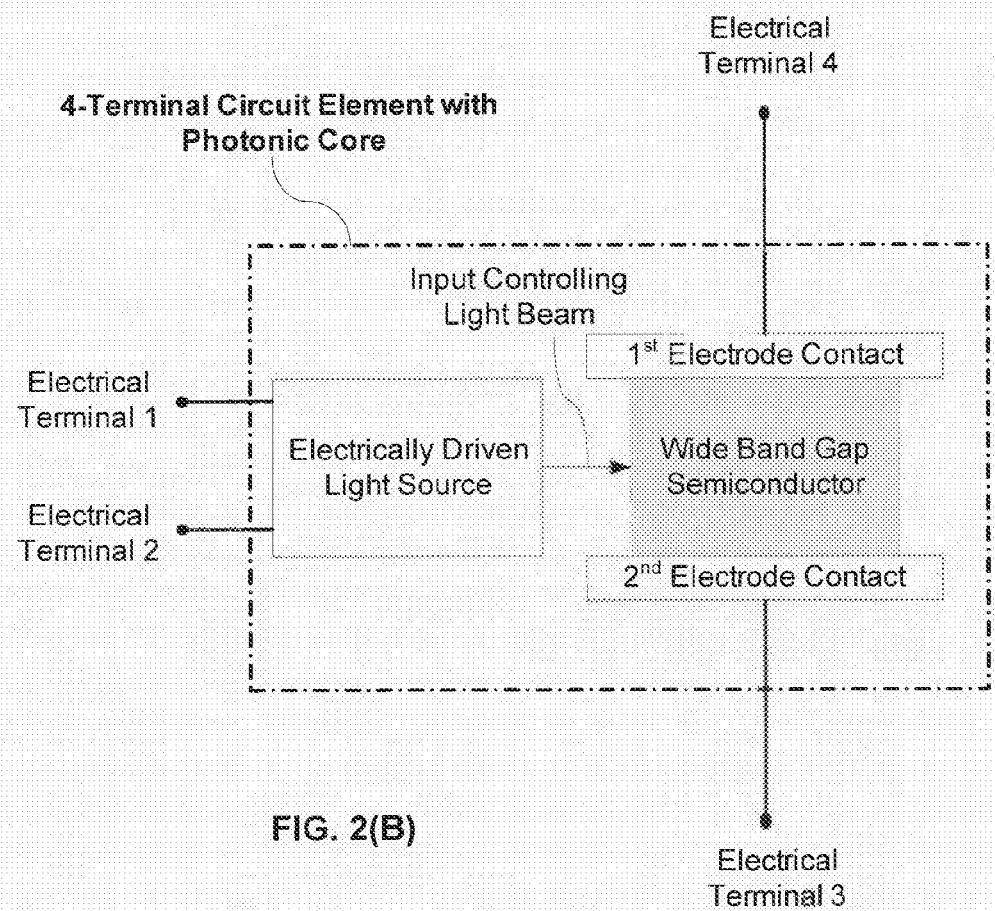
FIG. 2(B) shows an example of a 4-terminal circuit element based on the photonic core in FIG. 2(A)

FIG. 2(B) shows an example of a 4-terminal circuit element based on the photonic core in FIG. 2(A), where a light source is coupled to two electrical terminals 1 and 2 that electrically energize the light source to produce the controlling light beam for optically pumping a wide bandgap (WBG) semiconductor material. The WBG material is placed between two electrode contacts that are respectively connected to electrical terminals 3 and 4. The light source may include, e.g., one or more semiconductor lasers or semiconductor light-emitting diodes, to provide sufficient light to cause the photoconductivity in the WBG material. The optical intensity or power of the light source can be controlled via a voltage or current applied to the terminals 1 and 2 to control the photoconductivity in the WBG material. When the light is turned off or is at a low level that is insufficient to cause the photoconductivity inside the WBG material, the WBG material behaves like an electrical insulator with a high electrical resistance. The electrical conductivity inside the WBG material between the terminals 3 and 4 can be controlled or modulated by controlling the light from the light source via controlling the current or voltage applied to terminals 1 and 2. This 4-terminal circuit element can be configured as a 3-terminal circuit element by, e.g., connecting one of the terminals 1 and 2 with one of the terminals 3 and 4 and such a 3-terminal circuit element can be a direct replacement of a 3-terminal transistor based on the conventional junction technology.

For comparative purposes, in a classical semiconductor device based on the conventional p-n junction technology, the current through the device is controlled by applying a current or voltage to the controlling element of the device. These controlling element are often referred to as the "base," "gate," or "trigger electrode". The disclosed 4-terminal circuit element provides a controlled conduction through a wide bandgap material with optical energy. Thus, in the opticondistor, the optical source in FIGS. 2(A) and 2(B) serves the same function as the aforementioned controlling element in the conventional p-n junction technology.

Figure 3:
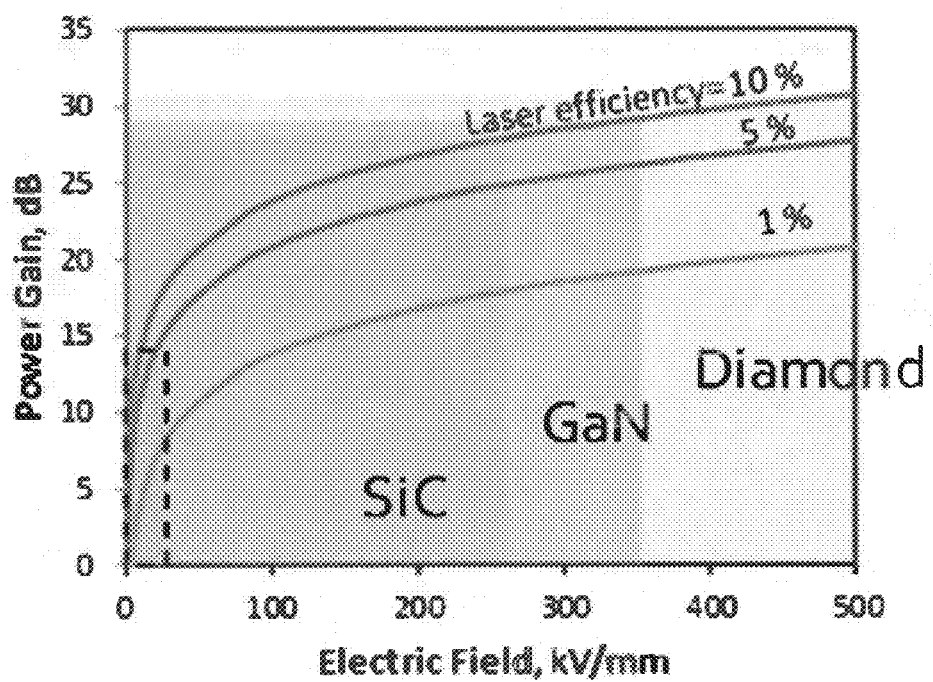
FIG. 3 shows comparative plots of power gain versus electric field for SiC, GaN and Diamond that can be used in accordance with exemplary embodiments.

The controlling element of a classic junction device requires power to function. A metric that defines the quality of such a device is the amount of power controlled divided by the power needed on the controlling element to cause the control. Such a ratio is usually expressed in decibels (abbreviated "dB") and is referred to as the "Power Gain." FIG. 3 shows comparative plots of power gain versus electric field for SiC, GaN and Diamond. For the purpose of illustration, the plots of FIG. 3 are generated using a classical laser system using these standard laser efficiencies that are shown in FIG. 3. It is understood, however, that other laser systems and efficiencies can be used for implementation of the disclosed opticondistors. Typically, the power gain for a classical junction device is in the range 10 to 15 dB, as illustrated by the dashed box at the lower left side of the plot in FIG. 3. For the opticondistors of the present application, the power gain is a function of the amount of power needed to create sufficient variation of the current through the bulk of the device. It is evident from FIG. 3 that as the electric field capability of the bulk material increases, the power gain of the opticondistor also increases. Further, even with very poor laser efficiencies of 1-10% (as is typical), the opticondistor shows much better efficiencies than standard junction devices such as the MOSFET.

Figure 4:
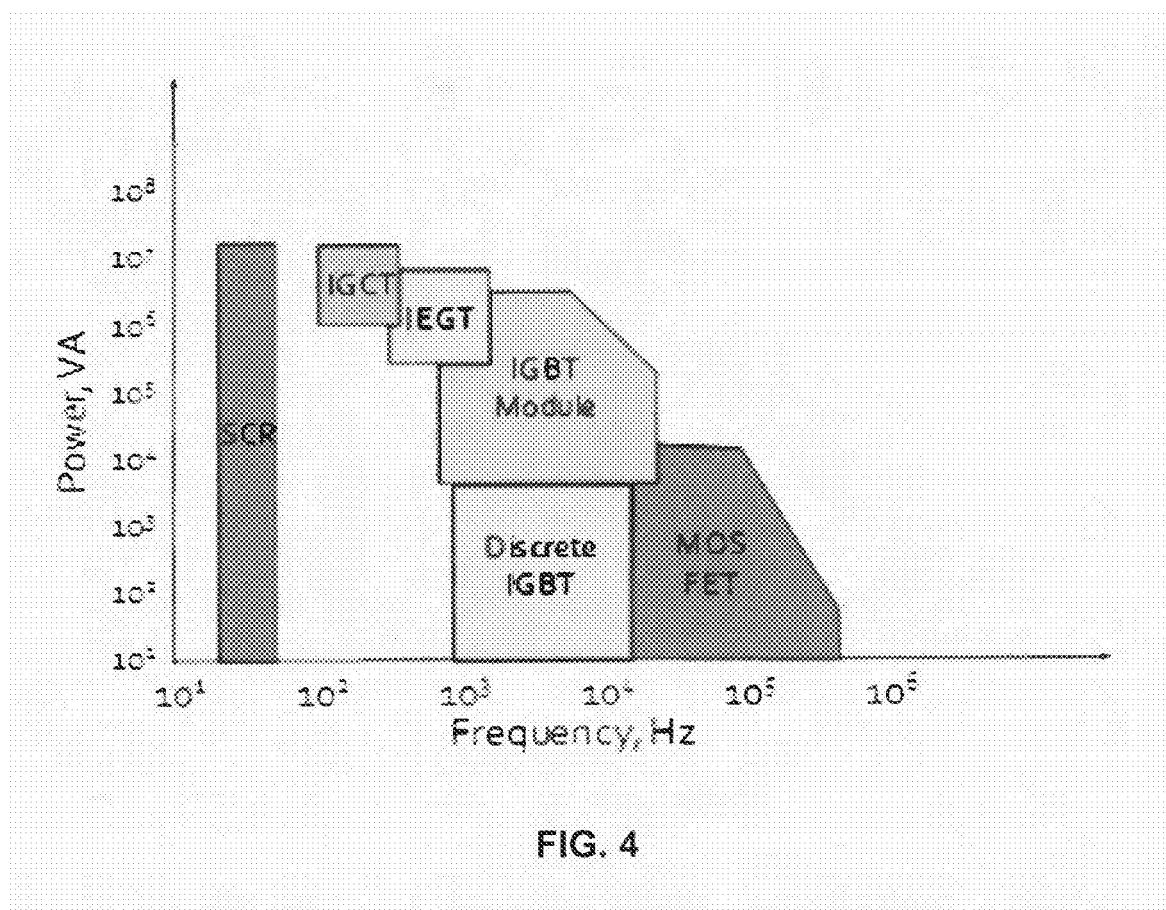
FIG. 4 shows comparative plots of power capability of various devices, including Silicon Controlled Rectifiers (SCRs), Injection Enhanced Gate Transistors (IEGTs) and Insulated Gate Bipolar Transistor (IGBTs), at various operating frequencies.

Another advantage of the disclosed opticondistors is made evident by the plot in FIG. 4. From this well-known plot of the power capability of various devices, including Silicon Controlled Rectifiers (SCRs), Injection Enhanced Gate Transistors (IEGTs) and Insulated Gate Bipolar Transistor (IGBTs), at various operating frequencies, it is clear that single devices are limited to below the mid-100 kHz operating frequency range and less that 10 MW peak power. It is also clear that the power capability of, for instance, the IGBT Module and MOSFET decrease substantially as the frequency increases. There has been a significant effort worldwide to attempt to go beyond these boundaries, but even with the very latest data, none have been successful.

An appreciation of this quest can be realized by considering some essential details of power "system" technology. The issue with such power systems is that step-up or step-down transformers are required to generate the proper voltages in such a system. Unfortunately, some type of iron based material is needed in these transformers to "concentrate" the magnetic flux created in the windings of the transformers. This flux concentration makes the transformer more efficient by increasing magnetic coupling between windings. The amount of iron needed for a given amount of power decreases with increasing frequency of the system. Thus, an increase in frequency reduces the amount of iron needed. Because losses at these frequencies are proportional to the amount of iron used, less iron also results in less wasted energy and a more energy efficient system results. Further, less loss means less heat generated. As a secondary result, ancillary system requirements are also impacted favorably.

Higher frequency at higher power is necessary to accomplish these goals, but is limited due to the measured characteristics of junction devices. In our measurements, however, we observe operational frequency of the opticondistor type technology to be in excess of 100's of MHz and powers exceeding many megawatts per device. Thus, the opticondistor technology is clearly outside the operational characteristics of standard junction devices shown in FIG. 4.

When all these effects are considered in office computer power supplies, internet servers, HVDC transmission and conversion, electric vehicles, and the like, it becomes clear that higher operating frequencies in the power equipment have significant advantages. Given the green energy mandates, high frequency technology such as the opticondistor technology will be necessary in the next generation power equipment.

It should also be noted that the controlling optical source that drives the wide bandgap material can be placed at any potential relative to the wide bandgap material itself. This capability results from the fact that conductive wire connections are not required between the controlling optical source and the wide bandgap material. Instead, since the coupling between the wide bandgap material and the controllable optical source can either be by free space transmission of the optical energy (e.g., through air, gas, vacuum, etc., with the use of reflective surfaces, lenses, or diffractive elements) or with some type of optical guiding structure (e.g., fiber optics), the controlling electronics can be at any potential relative to what is being controlled or switched. Each wide bandgap element can then be stacked ad-infinitum independently. Thus extremely high voltages can be controlled from an isolated controlling element at any potential. Various circuits based on the conventional junction technology to date cannot be configured in this manner without significant circuit complexities.

Figure 5:
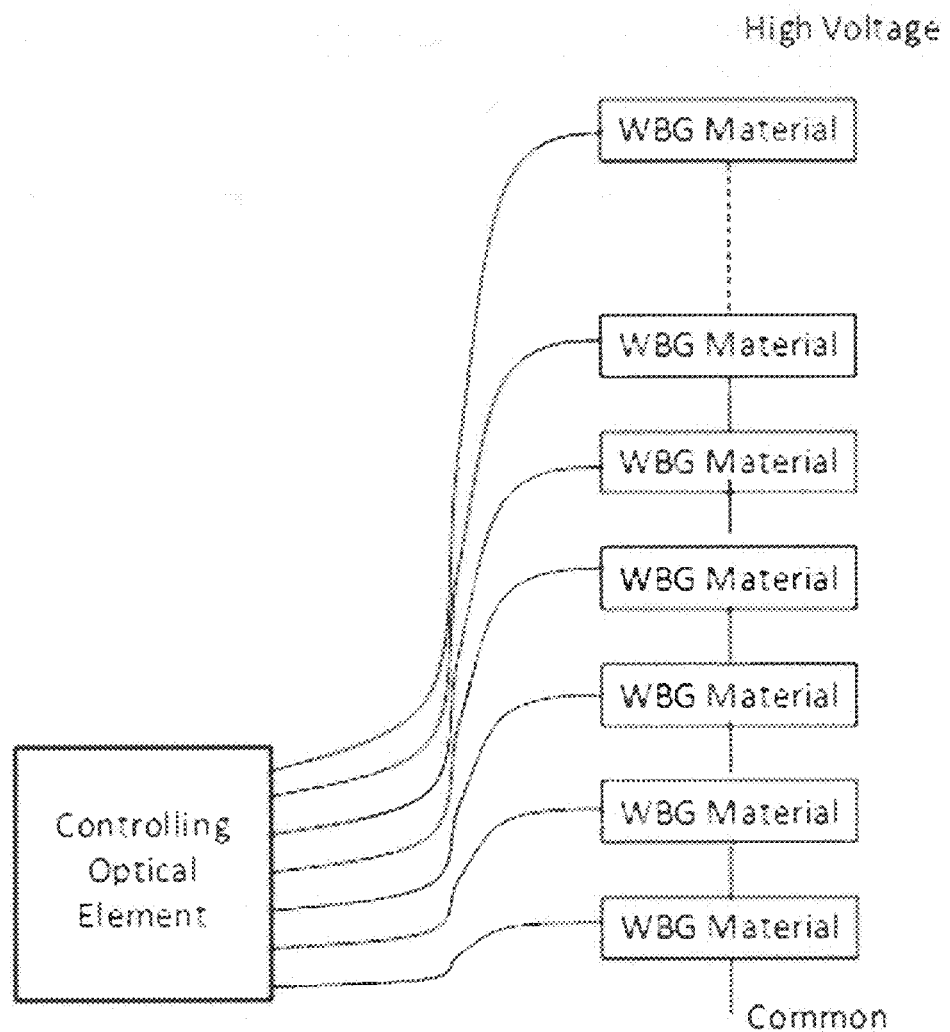
FIG. 5 illustrates a stack of multiple wide bandgap materials that can be used in a photonic core device in accordance with an exemplary embodiment.

FIG. 5 is an exemplary diagram that illustrates how such high voltages can be generated by stacking multiple wide bandgap material that are coupled to the controlling optical element.

Figure 6A:
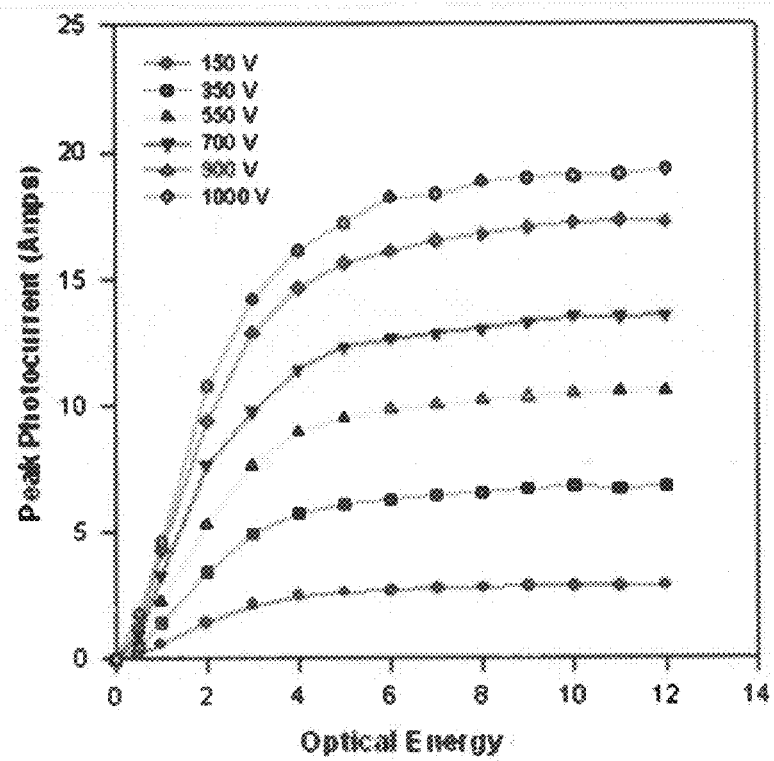
FIG. 6(A) shows transfer characteristics (output current as a function of controlling optical energy) under various voltages across the wide bandgap material.
Figure 6B:
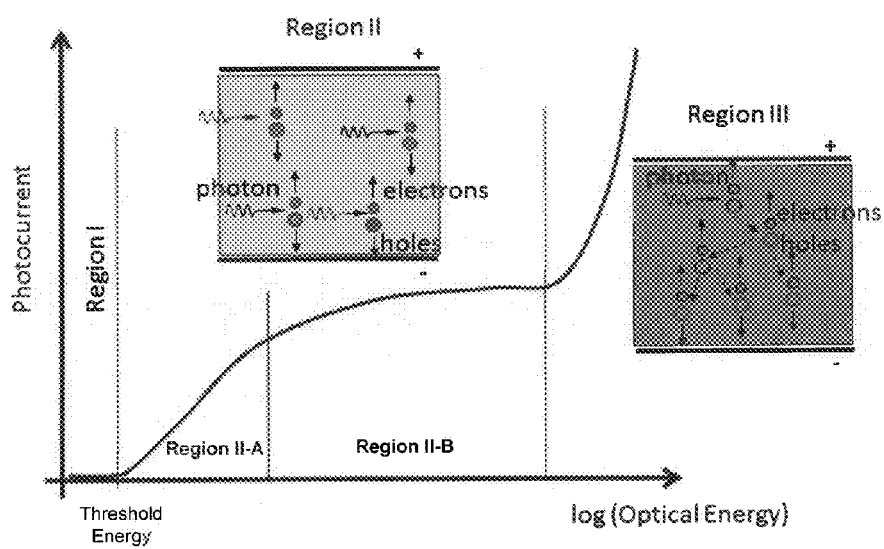
FIG. 6(B) illustrates an exemplary transfer chrematistic plot presented at a magnified scale.

FIGS. 6(A) and 6(B) show transfer characteristics (output current as a function of controlling optical energy) under various voltages across the WBG material.

FIG. 6(A) illustrates that a device based on the disclosed technology herein substantially relies on a predictable behavior between the independent variable of "Optical Energy" of the light directed to the wide bandgap material in the photonic core and the dependent variable "Photocurrent" generated by the wide bandgap material by absorption of light. This effect can be understood from FIG. 6(B).

In FIG. 6(B), a log scale on the horizontal axis is used to more clearly illustrate the concept. There are three principal regions of conduction defined as Region I, Region II, and Region III. The conduction current in Region I is low and depending on the material or material temperature, can be on the order $10^{-9}$ A. This low current is stochastic in nature, does not have a predictable dependence between Optical Energy and Photocurrent and is sometimes referred to as the "dark current." The low dark current results from the random energy in the WBG material or energy imparted by the environment to the material. The optical energy at the upper end of Region I is an optical threshold energy for triggering the photoconductivity in the WBG material. In FIG. 6(A), Region I corresponds to the region where the incident optical energy is below the threshold somewhere below "0.5" on the horizontal axis.

Region II in FIG. 6(B), which is also represented by the plots in FIG. 6(A), is a region when the input optical energy is above the optical threshold energy at the upper end of Region I and provides a substantially predictable and reproducible dependence between "Optical Energy" and "Photocurrent." In FIG. 6(A), Region II begins at the optical energy threshold somewhere below "0.5" on the horizontal axis. Region II includes a first region, Region II-A, in which the photocurrent significantly increases with the optical energy (e.g., in an approximately linear manner), and a second region, Region II-B, in which the photocurrent continues to increase with the optical energy at a slower rate than that in Region II-A and shows some "saturation" behavior. Region II-A in FIG. 6(B) corresponds to the incident optical energy in FIG. 6(A) between the threshold somewhere below "0.5" and around "3" on the horizontal axis. Region II-B in FIG. 6(B) corresponds to the incident optical energy in FIG. 6(A) between the threshold somewhere below "3" and somewhere beyond "12" on the horizontal axis. Region II may be referred to the "linear region" (although the dependence is not linear in the entire Region II) since the photocurrent generally increases with the incident optical energy and is characterized by single photons creating a fix number of charge carriers.

Region III is characterized by an avalanche condition inside the WBG material where a single photon can cause exponential growth in the number of charge carriers. Under this condition, charge carriers multiply uncontrollably as illustrated in the inset and are only limited by factors such as (1) the external circuit or (2) actual destruction of the device itself. The differentiating factors which affect operation between Regions II and III is the intentionally designed electric field. Low electric field keeps the device operation in Regions I and II and to move the operation from Region I to Region II only requires a slight increase in the optical drive. And finally, extremely high electric fields move the device into Region III. The devices described herein substantially rely on the so-called linear region described as Region II and can rely on the onset of Region III.

With the aforementioned and other advantages of the opticondistor over conventional junction devices, the four-terminal circuit element in FIGS. 2(A) and 2(B) can be used as a direct replacement for various junction semiconductor devices (e.g., transistors or diodes) or vacuum tube devices. The disclosed four-terminal circuit element can be used to control the output current in relationship to the controlling input optical energy. It is recognized that "optical" means any frequency and is not just limited to the visible spectrum. Further, it is also recognized that particle radiation also has a wavelike property and even though not detailed, is also considered in this disclosure.

Specific examples of several circuits and applications are provided in various figures of this document. Other applications and circuit designs based on the disclosed four-terminal circuit element are possible.

In each of the circuits described in this document, the classical semiconductor is replaced with an opticondistor. The base, gate, etc. of the semiconductor device is replaced with the controlling input of the optical source. The output terminals of the opticondistor is understood to be the high current or "controlled" side of the device. Because, unlike conventional devices, the opticondistor is not polarity sensitive, source, drain, or other polarity sensitive connections are not relevant for these applications. Further, it is understood that these example circuits can be cascaded, paralleled, placed in series, and used in any combination thereof.

Figure 7:
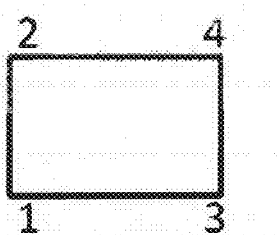
FIG. 7 illustrates a simplification of the opticondistor schematic based on the design in FIGS. 2(A) and 2(B).

FIG. 7 illustrates a simplification of the opticondistor schematic based on the design in FIGS. 2(A) and 2(B) that is provided to facilitate illustration of how an opticondistor can be placed in a larger circuit. Terminals 1 and 2 are coupled to the controlling input signals that control the optical input to the WBG material. In particular, terminals 1 and 2 can be used to activate the light source by receiving either a control current or voltage. Terminals 3 and 4 are the controlled output.

The exemplary circuits in FIGS. 8-17 rely substantially on operation in Region II. There are conditions, however, to economize on the light source requirement and attempt to push the device into the onset of Region III. Such applications would be useful in power switch and power management applications such as depicted in FIGS. 13(A) to (D), 14, 15, 17(B) and 18.

Figure 8A:
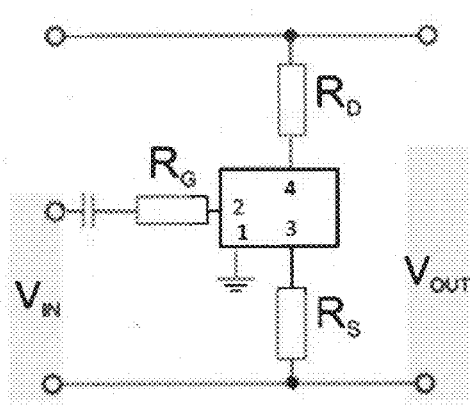
FIG. 8(A) illustrates an amplifier circuit that includes an opticondistor in accordance with an exemplary embodiment.
Figure 8B:
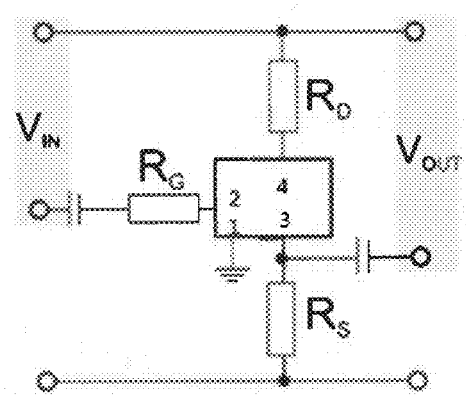
FIG. 8(B) illustrates another exemplary amplifier circuit that includes an opticondistor in accordance with an exemplary embodiment.
Figure 8C:
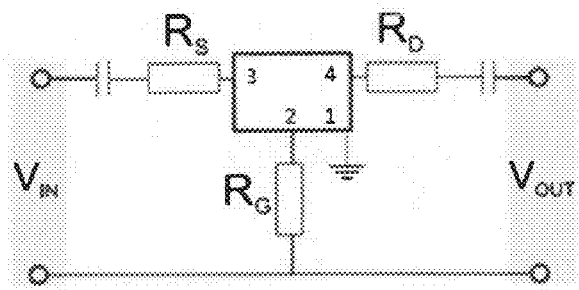
FIG. 8(C) illustrates another exemplary amplifier circuit that includes an opticondistor in accordance with an exemplary embodiment.

In the exemplary diagrams of FIGS. 8(A) to 8(C), the opticondistor is used to replace a transistor in an amplifier circuit, with the input voltage provided to the circuit is designated as $V_{in}$, and the output voltage of the circuit is designated as $V_{out}$. FIG. 8(A) illustrates an amplifier circuit that includes an opticondistor in accordance with an exemplary embodiment. In particular, terminal 1 of the opticondistor is connector to Ground, terminal 2 is connected to a gate resistor, $R_G$, terminal 3 is connected to a source resistor, $R_S$, and terminal 4 is connected to drain resistor, $R_D$. In FIG. 8(B) another exemplary amplifier circuit is shown, in which the opticondistor is configured in a similar way as in FIG. 8(A) but the input and output voltages are supplied to, and provided at, between different input/output terminals. In FIG. 8(C) yet another exemplary amplifier circuit is shown, in which terminals 3 and 4 of the opticondistor are connected to $R_S$ and $R_D$, respectively, while terminals 1 and 2 of the opticondistor are connected to Ground and $R_D$, respectively.

Figures 9A, 9B:
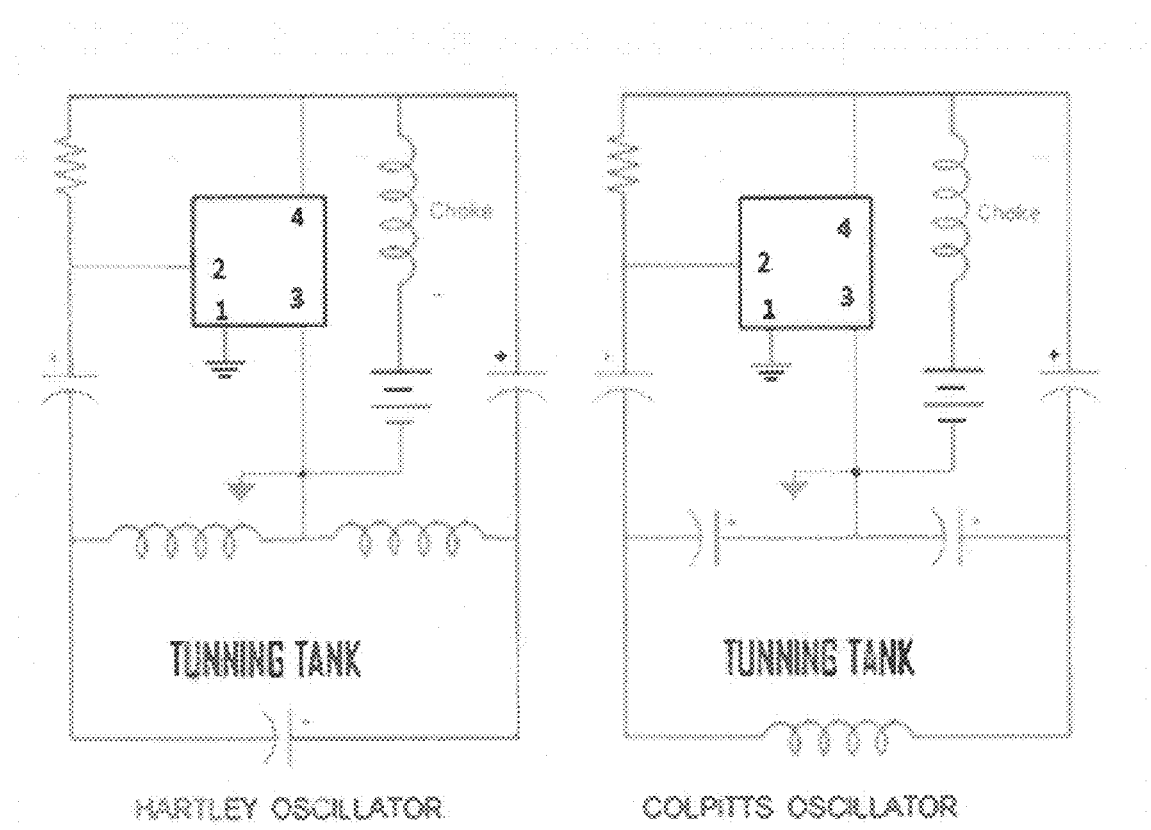
FIG. 9(A) illustrates a Hartley oscillator circuit in which a transistor is replaced with an opticondistor in accordance with an exemplary embodiment.
FIG. 9(B) illustrates a Colpitts oscillator circuit in which a transistor is replaced with an opticondistor in accordance with an exemplary embodiment.

FIGS. 9(A) and 9(B) illustrate exemplary oscillator circuits, in which a transistor is replaced with an opticondistor. In FIG. 9(A), the transistor (e.g., a JFET) in a Hartley Oscillator circuit is replaced with an opticondistor, whereas in FIG. 9(B), the transistor (e.g., a BJT) in a Colpitts Oscillator circuit is replaced with an opticondistor. In both oscillator circuits, terminals 1 and 3 of the opticondistor are connected to Ground, terminal 4 is connected to one terminal of the choke, and terminal 2 functions as the controlling input (e.g., base, gate, etc.).

Figure 10:
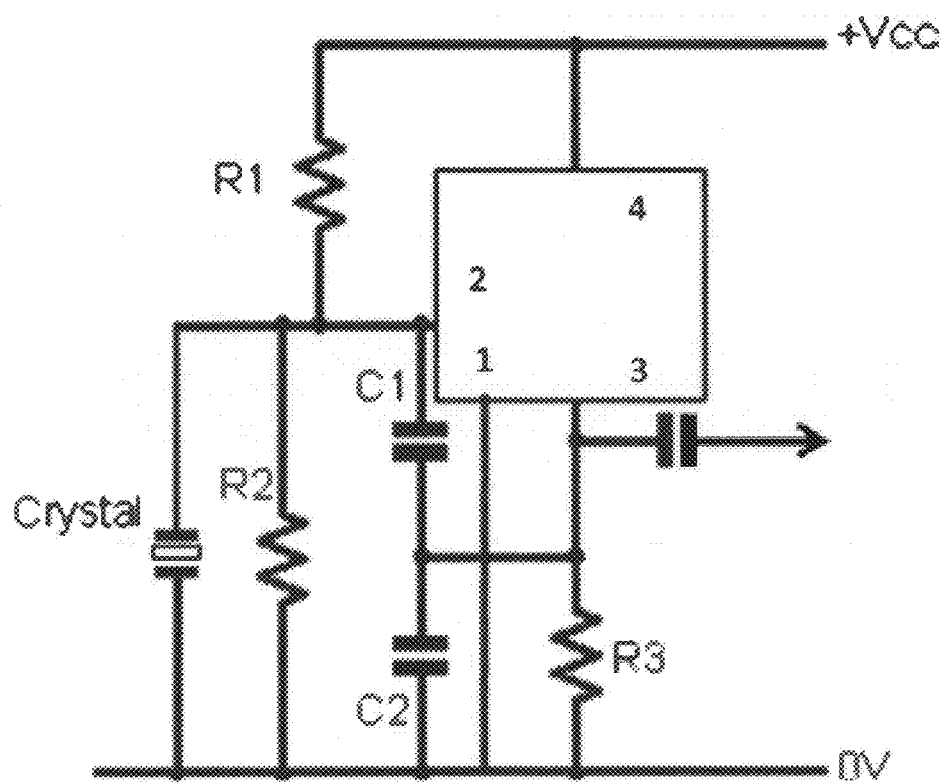
FIG. 10 illustrates an exemplary crystal oscillator circuit in which an opticondistor is used to replace an active element in the crystal oscillator circuit in accordance with an exemplary embodiment.
Figure 11:
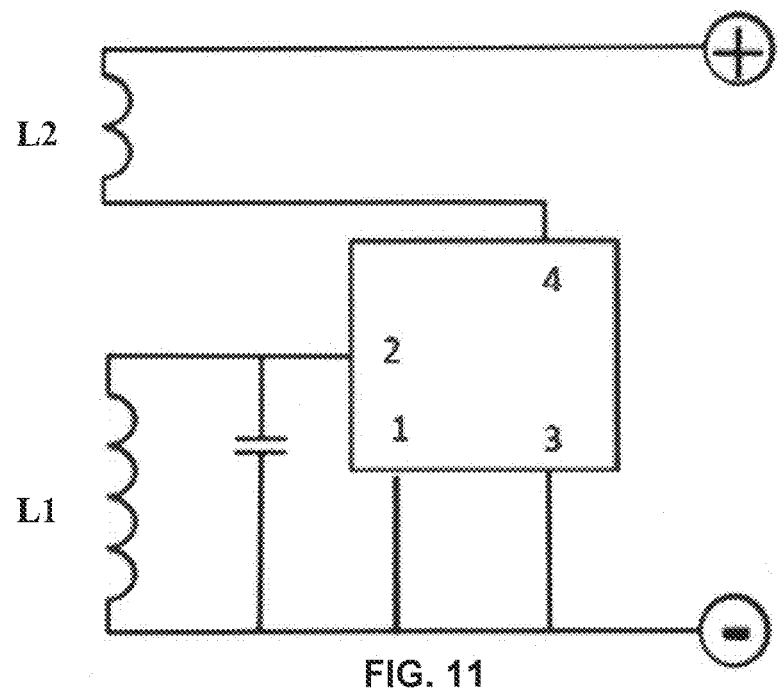
FIG. 11 illustrates an exemplary Armstrong Oscillator circuit in which an active element is replaced with an opticondistor in accordance with an exemplary embodiment.
Figure 12A:
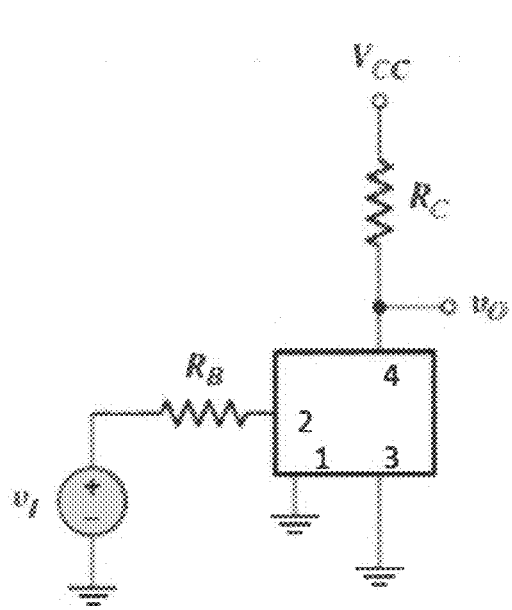
FIG. 12(A) illustrates a first signal source circuit in which an active element is replaced with an opticondistor in accordance with an exemplary embodiment.
Figure 12B:
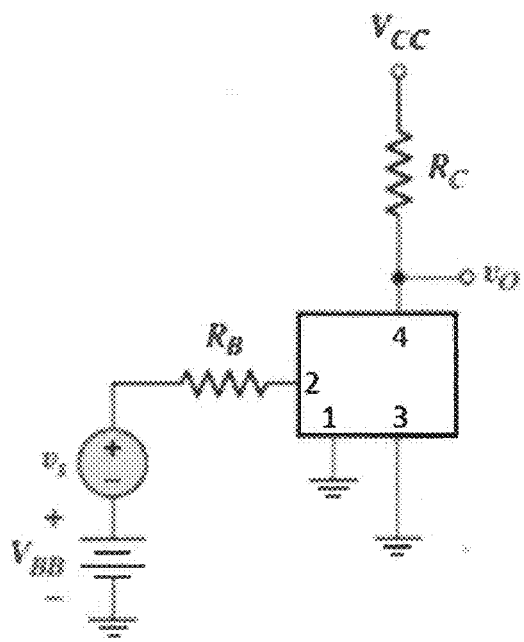
FIG. 12(B) illustrates a second signal source circuit in which an active element is replaced with an opticondistor in accordance with an exemplary embodiment.

FIG. 10 illustrates an exemplary crystal oscillator circuit, in which an opticondistor is used to replace an active element in the crystal oscillator circuit. In FIG. 11, the transistor (e.g., a FET) in an Armstrong Oscillator circuit is replaced with an opticondistor. As illustrated in FIG. 11, terminals 1 and 3 of the opticondistor are both connected to the negative terminal, with terminals 2 and 4 being connected to inductors L1 and L2 of the Armstrong Oscillator, respectively. FIGS. 12(A) and 12(B) illustrate two signal source circuits, in which an opticondistor is used as the active element, with terminals 1 and 3 being connected to Ground and terminal 4 providing the output voltage.

Figure 13A:
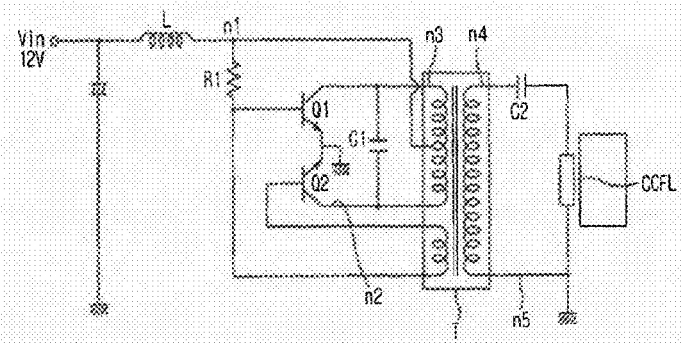
Figure 13B:
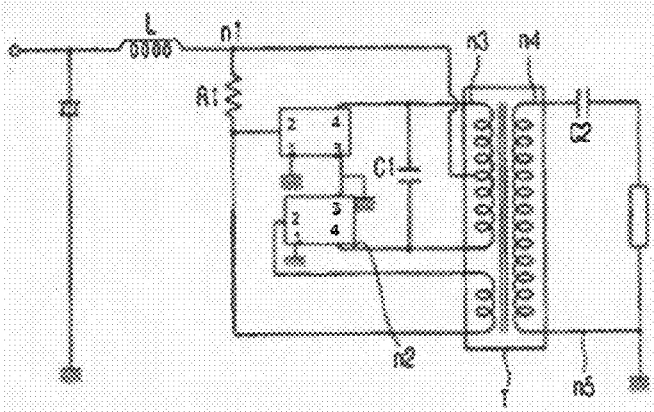
Figure 13B:
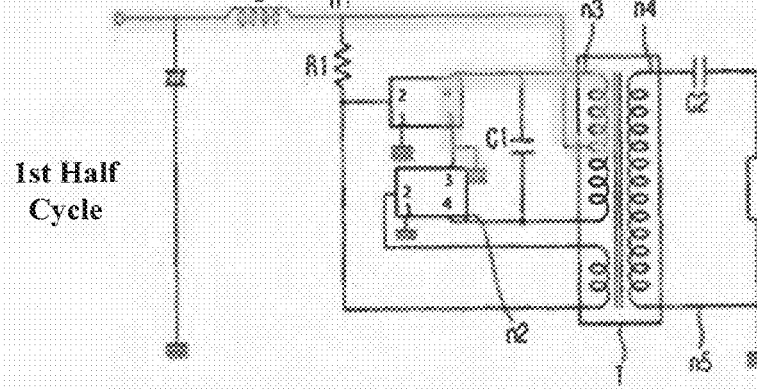
Figure 13B:
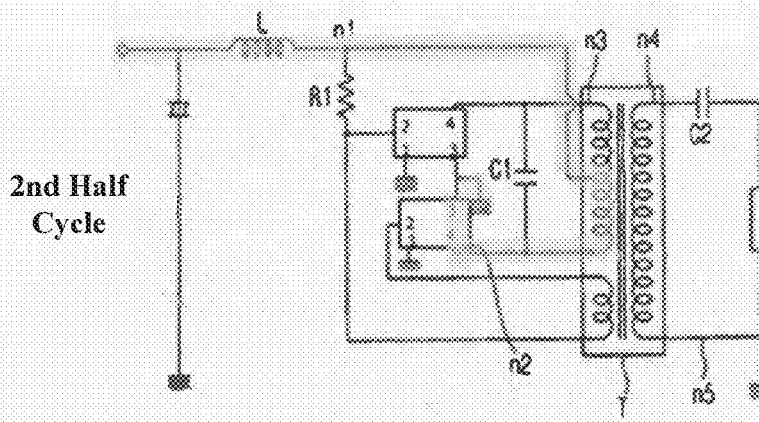

FIGS. 13(A) to 13(D) illustrate a DC to AC inverter circuit in which two transistors (e.g., BJTs) are replaced with two opticondistors. FIG. 13(A) shows the original circuit diagram that includes the conventional transistors, Q1 and Q2, and has been reproduced from U.S. Patent Application Publication No. 2008/0291353A1, which is herein incorporated by reference in its entirety for all purposes. FIG. 13(B) includes the opticondistors of the present application that replace the transistors of FIG. 13(A). The signal path for the 1st half cycle is highlighted in FIG. 13(C), and the path for the 2nd half of cycle is highlighted in FIG. 13(D). As illustrated in FIGS. 13(B) to (D), terminals 1, and 3 of both opticondistors are connected to Ground.

Figure 14:
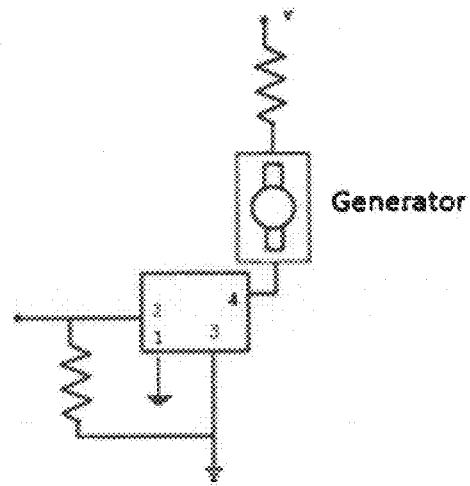
FIG. 14 shows a generator controller circuit that utilizes an opticondistor in accordance with an exemplary embodiment.
Figure 15A:
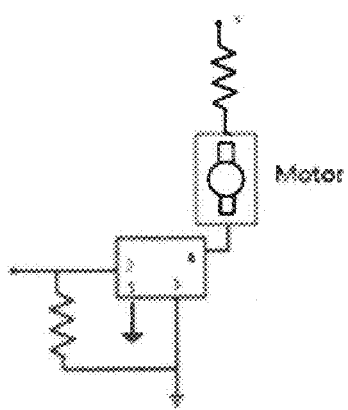
FIGS. 15(A) to 15(B) illustrate two configurations, where opticondistors have been used in motor controller circuits in accordance with exemplary embodiments.
Figure 15B:
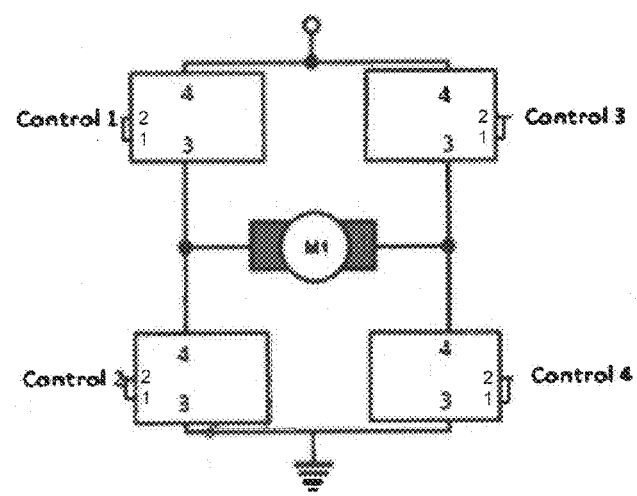
Figure 16A:
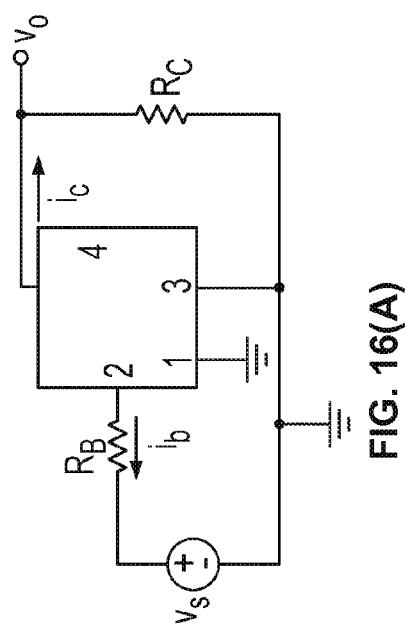
FIGS. 16(A) to 16(F) show six circuits in which active elements have been replaced with opticondistors in accordance with exemplary embodiments.
Figure 16B:
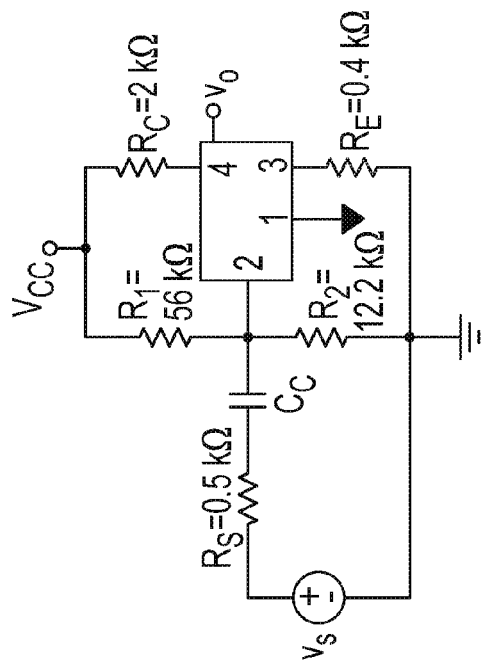
Figure 16C:
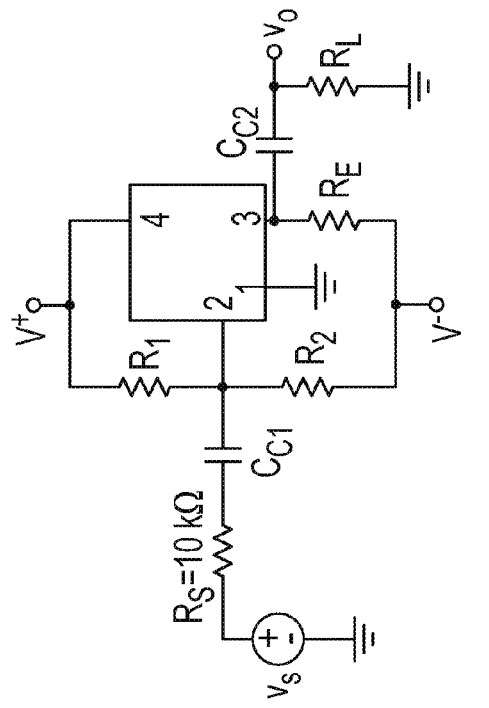
Figure 16D:
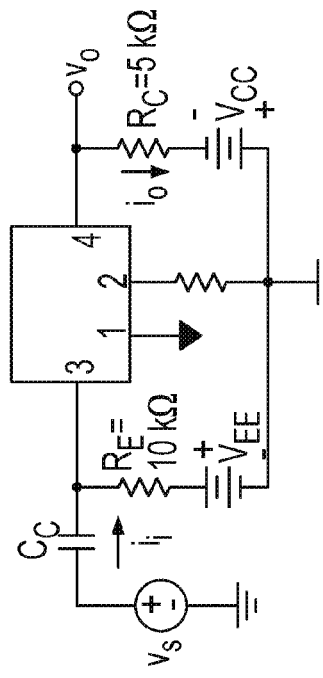
Figure 16F:
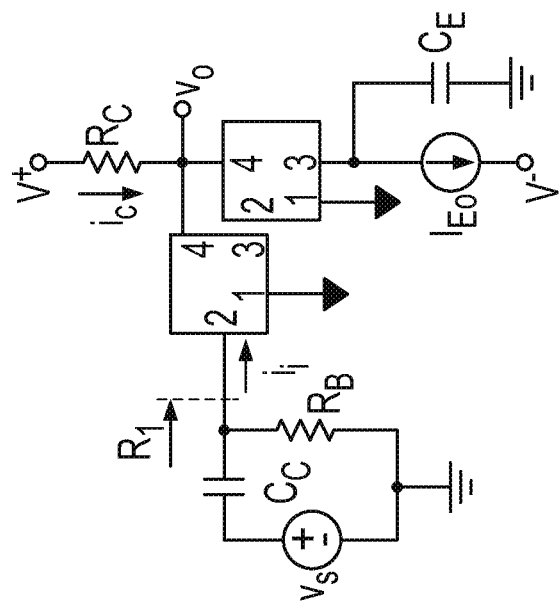
Figure 16E:
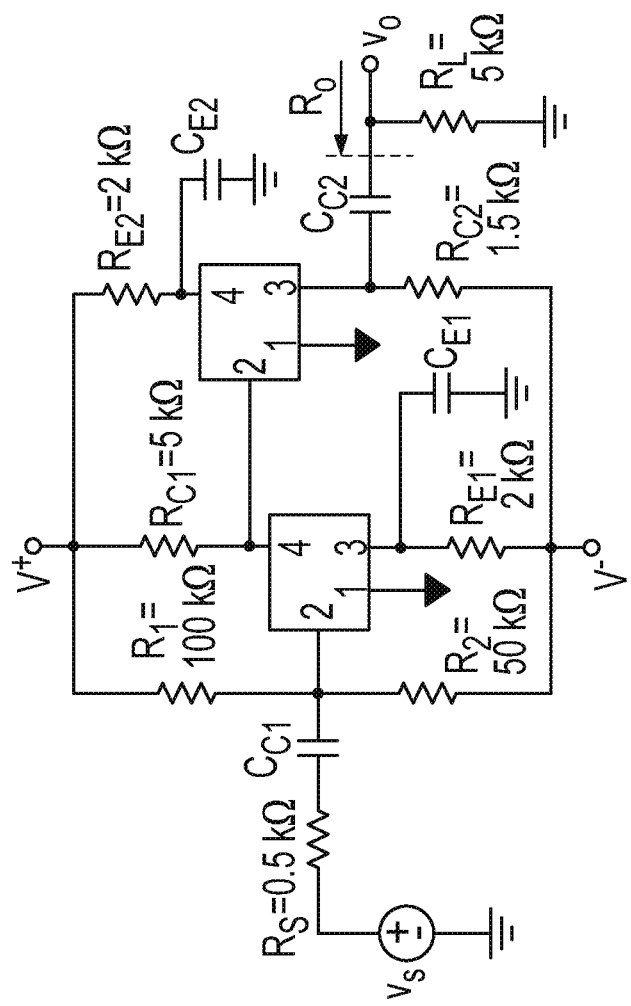

FIG. 14 shows a generator controller circuit that utilizes an opticondistor in accordance with an exemplary configuration. FIGS. 15(A) to 15(B) illustrate two exemplary configurations, where opticondistors have been used in motor controller circuits. FIGS. 16(A) to 16(F) and 17(A) to 17(B) show eight exemplary circuits in which active elements have been replaced with opticondistors in accordance with exemplary embodiments.

The ability to control the output power of generators and the speed of motors enables energy conservation. The greatest limitation in most large industrial systems is that present day semiconductor devices cannot achieve the capability of the opticondistor. As such, the added complexity makes such systems cost prohibitive.

FIG. 14 illustrates a system where, for instance, the current in the field coil in a generator is selectively set. For low power output, the current is set low and for high power output, that current is set high. Such control is useful for motor generator systems that need to operate at a constant rotational speed for best efficiency. Control of electric motors speed can be similarly done as is shown in FIG. 15(A) or FIG. 15(B). In 15(A), either the field coil or the armature coil may be controlled to control the speed. Or, for certain alternating current motors, the actual frequency of the applied power can be changed so as to control the motor rotational speed. FIG. 15(B) depicts an even more complex speed control for a motor with multiple independent windings using the same principals of control.

Figure 17A:
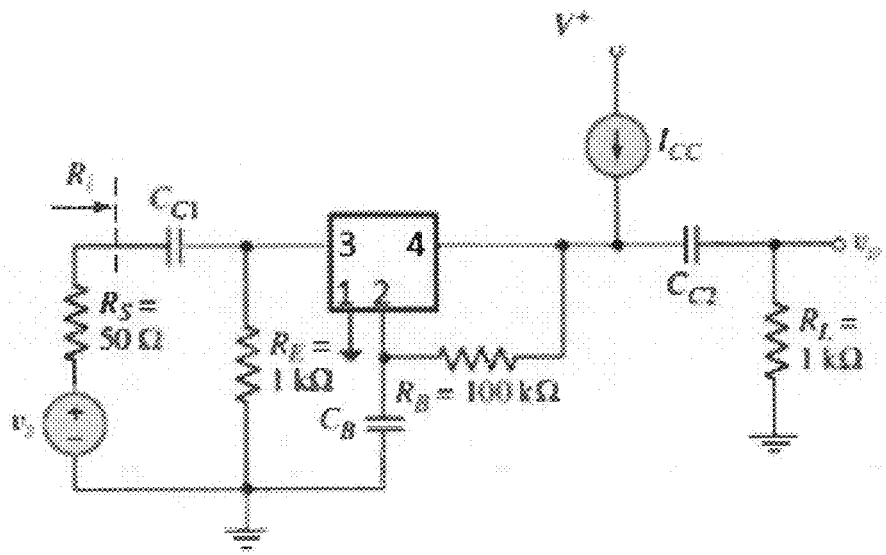
FIGS. 17(A) to 17(B) show two circuits in which active elements have been replaced with opticondistors in accordance with exemplary embodiments.

FIGS. 16 and 17 depict generalized classic transistor topologies where the transistor is replaced by the opticondistor. FIG. 16(A) through 16(D) produce amplification based on the proper choice of resistance values. Although the voltage source is shown as a DC source, it could very easily be replaced by an AC source or signal to be amplified. Amplification can be understood as a ratio of output to input, whether positive or negative and potentially having real and imaginary parts. FIGS. 16(E) and 16(F) show the same principals except that the opticondistor stages are cascaded. FIG. 16(D) and FIG. 17(A) are specialized amplifier circuits where the input and output share a common terminal and the resistance between the two are controlled.

Figure 17B:
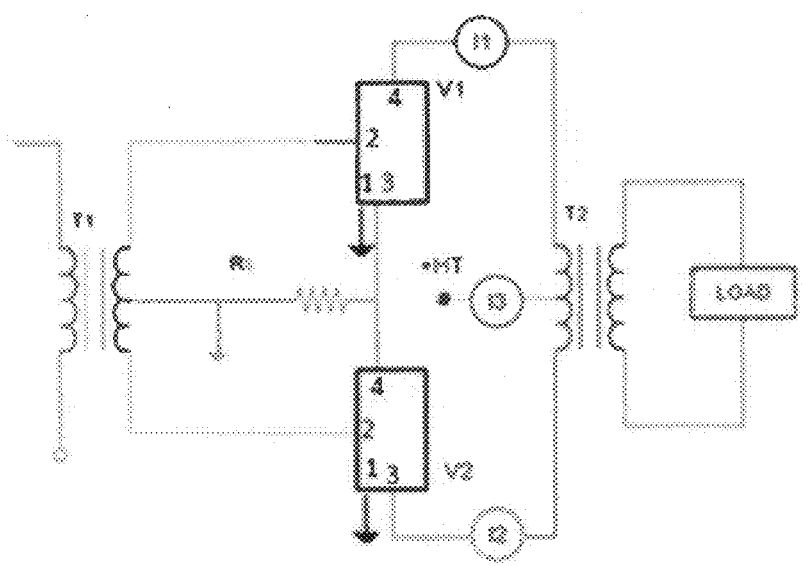
Figure 18:
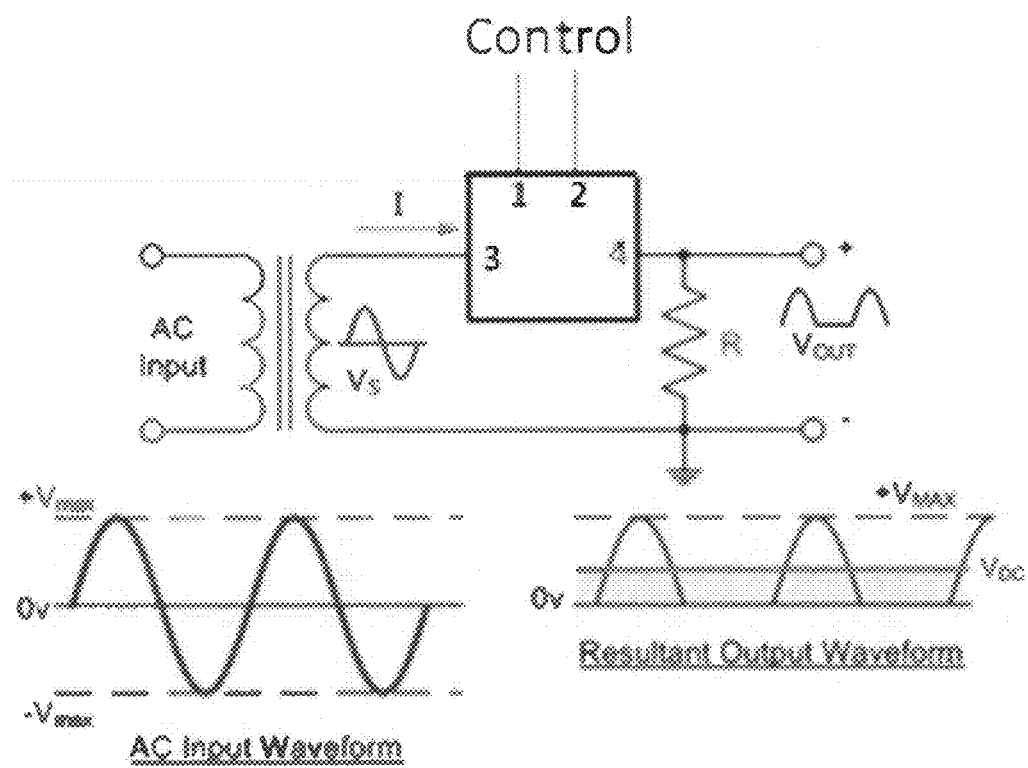
FIG. 18 shows a circuit that an opticondistor is utilized to control power to a load in accordance with an exemplary embodiment.

FIG. 17(B) is a classic inverter circuit with transformer input and output. It should be understood that the bipolar feature is not a requirement for the inverter operation, nor are the transformers. Rather, the opticondistor, in its simplest form, can function as a chopper to transform DC current into AC current FIG. 18 shows a circuit that an opticondistor is utilized to control power to a load. In this simple circuit, by controlling the "ON" time or duty cycle of, in this case, an AC waveform, DC output can be produced. With slightly more complexity a full wave or multi phase waveform can similarly be controlled. With AC or DC, the duty cycle can be regulated so that power to the load R can be controlled, as well.

The above circuit examples illustrate that the disclosed four-terminal circuit element with the photonic core based on a wide bandgap (WBG) material and a controllable optical source that causes a variation of the current through the bulk of the WBG material (either singly, in parallel, in series, or any combination) can be used so that at least one terminal of the WBG material is connected to a common portion of a circuit and the opposing terminal connected to the controlled portion of the circuit. This design effects a control between the two as defined by the optical controlling input. In applications, the disclosed 4-terminal circuit element with the photonic core can use the connection of the WBG material terminal to connect to a passive circuit element or active circuit element, for example, a resistor, capacitor, inductor, motor, generator, or transformer, or active circuit device or combination thereof.

Some of the above described examples use resistors as examples of more general circuit elements to provide circuit connections and desired impedance characteristics for proscribed operations or functions of the disclosed devices. In various implementations of the disclosed technology herein, circuit elements having desired impedance values may be used. Such a circuit element with a desired impedance characteristic may include a combination of circuit elements, whether active or passive, that presents an impedance to a device disclosed above, functions in an equivalent or substantially similar manner.

In one particular implementation, the circuit device is constructed that includes electrical circuit elements electrically coupled to form a circuit, and a circuit element with a photonic core and electrical terminals electrically coupled to the circuit formed by the electrical circuit elements. Such a circuit element with a photonic core includes a first electrical terminal that provides a first electrical contact, a second electrical terminal that provides a second electrical contact, a third electrical terminal that provides a third electrical contact, and a fourth electrical terminal that provides a fourth electrical contact. The circuit element with a photonic core also includes a light source coupled to the first and second electrical terminals to receive an electrical control signal and operable to produce light in response to the electrical control signal, where the light source is configured to vary an optical power in the produced light in response to an amplitude or power of the electrical control signal. The circuit element with a photonic core additionally includes a wide bandgap material located to receive the light from the light source and configured to exhibit a photoconductivity in response to the light, a first electrode coupled to the wide bandgap material and connected to the third electrical terminal, and a second electrode coupled to the wide bandgap material and connected to the third electrical terminal, the first and second electrodes being located at different locations on the wide bandgap material to provide electrical contacts to allow an electrical current to flow through.

Such a circuit device can include an electrical amplifier that amplifies an electrical signal and is electrically coupled to the circuit formed by the electrical circuit elements, where the electrical amplifier includes the circuit element with the photonic core as an internal circuit element for the electrical amplifier. The first electrical terminal and the third electrical terminal of the circuit element with the photonic core can be connected to each other to form a common electrical terminal to render the circuit element with the photonic core a 3-terminal circuit element having the common electrical terminal and the second and fourth electrical terminals can be coupled to the circuit formed by the electrical circuit elements. For instance, the circuit element with the photonic core is coupled to function as a transistor in the circuit formed by the electrical circuit elements.

In one particular implementation, the circuit device can include an electrical AC to DC converter that converts an AC signal into a DC signal and is electrically coupled to the circuit formed by the electrical circuit elements, wherein the electrical AC to DC converter includes the circuit element with the photonic core as an internal circuit element for the AC to DC converter. In another particular implementation, the circuit element with the photonic core can be coupled to the circuit formed by the electrical circuit elements to provide an electrical switch between the third and fourth electrical terminals based on the control electrical signal applied to the first and second electrical terminals.

In describing the disclosed embodiments, sometimes separate components have been illustrated as being configured to carry out one or more operations. It is understood, however, that two or more of such components can be combined together and/or each component may comprise sub-components that are not depicted. Further, the operations that are described in various figures of the present application are presented in a particular sequential order in order to facilitate the understanding of the underlying concepts. It is understood, however, that such operations may be conducted in a different sequential order, and further, additional or fewer steps may be used to carry out the various disclosed operations.

The above examples of 4-terminal circuit elements with a photonic core can be used as an electronic circuit element in a way similar to a 4-terminal all electronic circuit element in various electronic circuits, devices or appliances because, despite its photonic core, the disclosed 4-terminal circuit element with a photonic core has 4 electrical terminals for interfacing with other electronic contacts, electronic circuit components or circuitry. As illustrated in FIG. 7, in terms of being connected or coupled to other electronics, the disclosed 4-terminal circuit element with a photonic core is similar to a conventional electronic circuit element with 4 terminals.

Figure 19:
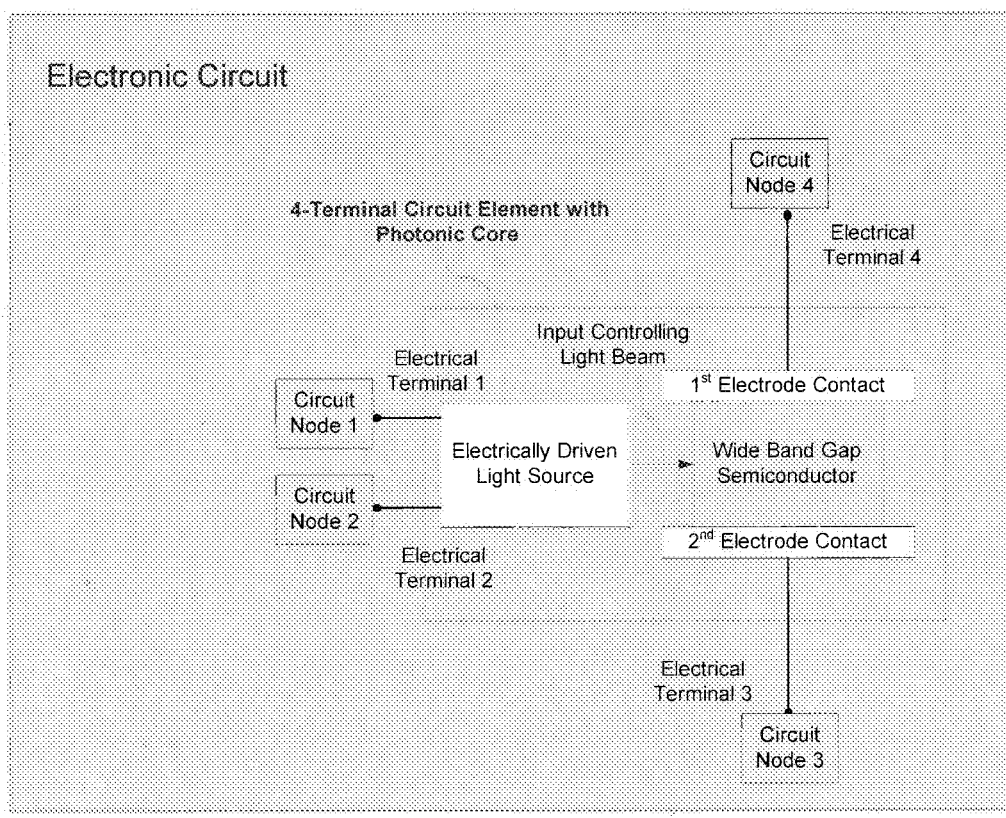
FIG. 19 illustrates an example of an electronic circuit or device that contains, various electronic circuit elements and such a 4-terminal circuit element with a photonic core.

FIG. 19 illustrates an example of an electronic circuit or device that contains, various electronic circuit elements and such a 4-terminal circuit element with a photonic core. The four electronic or electrical terminals, terminals 1-4, are respectively connected to four circuit nodes 1-4 so as to be connected with electrical conductive lines, contacts or other electronic components to form a desired overall circuit configuration for the illustrated electronic device. FIGS. 8-18 above further provide specific circuit or device examples that implement the general electronic device configuration in FIG. 19. The device in FIG. 19 may include a power supply that supplies a DC power or AC power to the device and to energize the disclosed 4-terminal circuit element with a photonic core and other circuit elements therein. Therefore, to some extent, the device in FIG. 19 includes, one or more electrical conductive contacts or electronic circuit elements that are coupled to form the four circuit nodes 1-4 as shown for connecting or coupling to the disclosed 4-terminal circuit element with the photonic core. The one or both of the first and the second terminals are operable as input terminals to receive an input controlling signal, and one or both of the third and the fourth terminals are operable as output terminals to provide an electrical or electronic output signal controlled at least in-part by the input controlling signal such that the disclosed 4-terminal circuit element with the photonic core, via its connections via the circuit nodes 1-4, to provide an electronic function or operation as part of the overall operation of the device in FIG. 9. The electrical or electronic output signal controlled at least in-part by the input controlling signal may be, in some implementations, a continuously varying output signal.

While this document contains many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A four-terminal circuit element with a photonic core, comprising:
   a first terminal that provides a first electrical contact;
   a second terminal that provides a second electrical contact;
   a third terminal that provides a third electrical contact;
   a fourth terminal that provides a fourth electrical contact;
   a light source coupled to the first and the second terminals to receive an electrical signal and operable to produce light in response to the electrical signal;
   a wide bandgap material in contact with a first electrode coupled to the third terminal and a second electrode coupled to the fourth terminals to allow an electrical current to flow between the first and second electrodes, the wideband gap material positioned to receive the light produced by the light source and configured to exhibit a photoconductivity in response to the received light, wherein
   one or both of the first and the second terminals are operable as input terminals to receive an input controlling signal, and one or both of the third and the fourth terminals are operable as output terminals to provide an output signal controlled at least in-part by the input controlling signal.

2. The four-terminal circuit element of claim 1, wherein the wide bandgap material comprises silicon carbide (SiC) or gallium nitride (GaN).

3. The four-terminal circuit element of claim 1, wherein the light source comprises one of a semiconductor laser or a semiconductor light-emitting diode.

4. The four-terminal circuit element of claim 1, wherein the light source is a laser light source operable with an efficiency in the range 1 to 10 percent.

5. The four-terminal circuit element of claim 1, wherein the output signal is a continuously varying output signal that varies in response to a change in photoconductivity of the wide bandgap material caused at least in-part by the received light at the wide bandgap material.

6. The four-terminal circuit element of claim 1, wherein the output signal is a continuously varying output signal that is an amplified version of the input controlling signal.

7. The four-terminal circuit element of claim 1 operable to produce a power gain in the range 15 to 30 decibels.

8. The four-terminal circuit element of claim 1, operable at a frequency of at least 100 MHz.

9. The four-terminal circuit element of claim 1, operable to produce the output signal having a power of at least 200 megawatts.

10. The four-terminal circuit element of claim 1, wherein the electrical signal provided to the first and the second terminals is at an arbitrary potential level relative to a potential level established across the wide bandgap material.

11. The four-terminal circuit element of claim 1, operable as an electrical active circuit element.

12. The four-terminal circuit element of claim 1, operable to function as a plurality of active elements in a plurality of corresponding configurations.

13. The four-terminal circuit element of claim 12, wherein the four-terminal circuit element operable to function as a diode in a first configuration and as a transistor in a second configuration.

14. The four-terminal circuit element of claim 1, comprising:
a plurality of wide bandgap elements, each wide bandgap element positioned between a pair of corresponding contact electrodes to maintain at least a first of the plurality of wide bandgap elements at a different potential level than at least a second of the plurality of wide bandgap elements, each wide bandgap elements positioned to receive the light produced by the light source.

15. The four-terminal circuit element of claim 14, wherein one of the contact electrodes from each of the wide bandgap elements is at a common potential level.

16. A circuit, comprising:
one or more power supplies;
one or more passive circuit elements; and
at least one four-terminal circuit element, comprising
a first terminal that provides a first electrical contact;
a second terminal that provides a second electrical contact;
a third terminal that provides a third electrical contact;
a fourth terminal that provides a fourth electrical contact;
a light source coupled to the first and the second terminals to receive an electrical signal and operable to produce light in response to the electrical signal;
a wide bandgap material in contact with a first electrode coupled to the third terminal and a second electrode coupled to the fourth terminals to allow an electrical current to flow between the first and second electrodes, the wideband gap material positioned to receive the light produced by the light source and configured to exhibit a photoconductivity in response to the received light, wherein
one or both of the first and the second terminals are operable as input terminals of the four-terminal circuit element to receive an input controlling signal, and one or both of the third and the fourth terminals are operable as output terminals of the four-terminal circuit element to provide an output signal controlled at least in-part by the input controlling signal.

17. The circuit of claim 16, wherein the four-terminal circuit element is configured to operate as an active element in the circuit.

18. The circuit of claim 16, configured as an amplifier circuit and including:
a first passive element coupled to the second terminal,
a second passive element coupled to the third terminal, and
a third passive element coupled to the fourth terminal, wherein the second terminal is at a ground potential level.

19. The circuit of claim 18, wherein the second, fourth and third terminals are configured as a gate, drain and souse transistor terminals, respectively.

20. The circuit of claim 16, wherein the circuit is an oscillator circuit, and the four-terminal circuit element is configured to operate as a transistor in the oscillator circuit.

21. The circuit of claim 20, wherein the oscillator circuit is one of a Hartley oscillator circuit or a Colpitts oscillator circuit.

22. The circuit of claim 16, wherein the circuit is a crystal oscillator circuit, and the four-terminal circuit element is configured to operate as an active element in the oscillator circuit.

23. The circuit of claim 16, wherein the circuit is an amplifier circuit, and the four-terminal circuit element is configured to operate as an active element in the amplifier circuit.

24. The circuit of claim 16, wherein the circuit is an AC-to-DC converter circuit, and the four-terminal circuit element is configured to operate as an active element in the an AC-to-DC converter circuit.

25. The circuit of claim 16, wherein the circuit is a generator controller circuit, and the four-terminal circuit element is configured to operate as an active element in the generator controller circuit.

26. The circuit of claim 16, wherein the circuit is a motor controller circuit, and the four-terminal circuit element is configured to operate as an active element in the motor controller circuit.

27. The circuit of claim 16, wherein:
the first terminal and the third terminal of the four-terminal circuit element are connected to each other to form a common electrical terminal to render the four-terminal circuit element a three-terminal circuit element having the common electrical terminal and the second and fourth terminals that are coupled to the one or more passive elements.

28. The circuit of claim 16, wherein the output signal of the four-terminal circuit element is continuously variable in response to at least in-part variations in the input controlling signal.

29. The circuit of claim 16, wherein the four-terminal circuit element is configured to replace an active element in the circuit.

30. The circuit of claim 29, wherein the active element is one of: a diode, a transistor, or a signal source.

* * * * *